(12) United States Patent
Wang et al.

(10) Patent No.: US 12,721,091 B2
(45) **Date of Patent: *Aug. 25, 2026**

(54) SYSTEMS AND METHODS FOR SHUTTERED WAFER CLEANING

(71) Applicant: Taiwan Semiconductor Manufacturing Co., Ltd., Hsinchu City (TW)

(72) Inventors: Tsui-Wei Wang, Hsinchu City (TW); Yung-Li Tsai, Houlong Town (TW); Chui-Ya Peng, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 143 days.

This patent is subject to a terminal disclaimer.

(21) Appl. No.: 18/767,854

(22) Filed: Jul. 9, 2024

(65) Prior Publication Data

US 2024/0363377 A1 Oct. 31, 2024

Related U.S. Application Data

(60) Continuation of application No. 17/737,765, filed on May 5, 2022, now Pat. No. 12,068,179, which is a division of application No. 16/551,352, filed on Aug. 26, 2019, now Pat. No. 11,355,366.

(60) Provisional application No. 62/724,862, filed on Aug. 30, 2018.

(51) Int. Cl.

| | |
|---|---|
| ***H10P 72/00*** | (2026.01) |
| ***B08B 15/04*** | (2006.01) |
| ***H10P 70/00*** | (2026.01) |

(52) U.S. Cl.

CPC .......... *H10P 72/0448* (2026.01); *B08B 15/04* (2013.01); *H10P 70/20* (2026.01); *H10P 72/0414* (2026.01)

(58) Field of Classification Search

CPC ... H10P 72/0448; H10P 70/20; H10P 72/0414

See application file for complete search history.

(56) References Cited

U.S. PATENT DOCUMENTS

| | | | |
|---|---|---|---|
| 5,261,566 | A | 11/1993 | Nakayama |
| 5,928,425 | A | 7/1999 | Lee |
| 7,637,029 | B2 | 12/2009 | Kamikawa et al. |
| 2005/0170072 | A1 | 8/2005 | Kwak et al. |
| 2008/0100809 | A1 | 5/2008 | Nakashima et al. |
| 2010/0236579 | A1 | 9/2010 | Araki et al. |
| 2011/0240601 | A1 | 10/2011 | Hashizume et al. |
| 2012/0006361 | A1 | 1/2012 | Miyagi et al. |
| 2012/0325274 | A1 | 12/2012 | Kai et al. |

(Continued)

FOREIGN PATENT DOCUMENTS

TW 201921470 A 6/2019

*Primary Examiner* — Jason Y Ko

(74) *Attorney, Agent, or Firm* — Harrity & Harrity, LLP

(57) ABSTRACT

In an embodiment, a system includes: a wafer support configured to secure a wafer; a nozzle configured to dispense a liquid or a gas on the wafer when the nozzle is in an active state of dispensing; a shutter configured to catch the liquid from the nozzle when the shutter is in a first position below the nozzle; and a shutter actuator configured to: move the shutter to the first position in response to the nozzle not being in an inactive state; move the shutter to a second position away from the first position in response to the nozzle being in the active state.

20 Claims, 16 Drawing Sheets

(56) References Cited

U.S. PATENT DOCUMENTS

| | | | |
|---|---|---|---|
| 2014/0182634 | A1 | 7/2014 | Ishibashi |
| 2020/0075352 | A1 | 3/2020 | Wang et al. |

400

SYSTEMS AND METHODS FOR SHUTTERED WAFER CLEANING

CROSS-REFERENCE TO RELATED APPLICATION

This application is a continuation of U.S. patent application Ser. No. 17/737,765, filed May 5, 2022, which is a division of U.S. patent application Ser. No. 16/551,352, filed Aug. 26, 2019, which claims priority to U.S. Provisional Patent Application No. 62/724,862, filed on Aug. 30, 2018, each which are incorporated by reference herein in their entireties.

BACKGROUND

Integrated circuits are formed on wafers, or semiconductor substrates. The formation of the integrated circuits may include numerous processing steps such as deposition of various layers, etching, and baking. The integrated circuits may be separated into individual dies, which are packaged and attached to circuit boards.

During the various processing steps to create the integrated circuits, various surfaces are formed on the surface of the wafer. Also, artifacts may be deposited along the surface of the wafer during processing. Accordingly, it may be desirable to clean the wafer of these artifacts in order to increase the production yield of the wafers.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
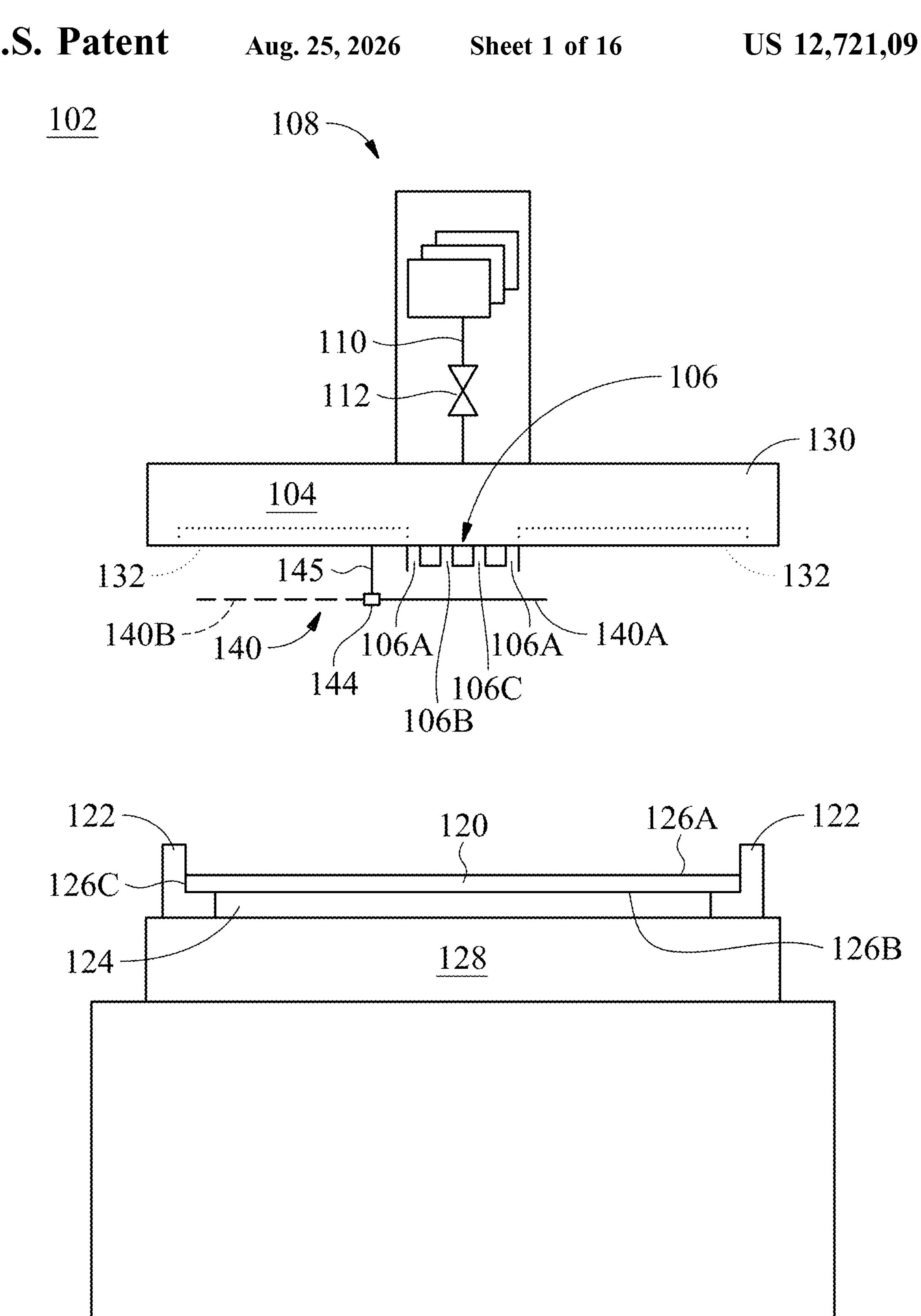
FIG. 1 is a side view diagram of a shuttered wafer cleaning system, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As noted above, undesirable artifacts may be cleaned from a wafer by applying a liquid cleaning solution to the wafer. The liquid cleaning solution may be applied to the wafer by immersing the wafer within the liquid cleaning solution and/or applying the liquid cleaning solution to the wafer. In certain embodiments, while the liquid cleaning solution is applied to the wafer, the wafer may also be spun to distribute the liquid cleaning solution along the wafer (e.g., spin cleaning). However, in the course of cleaning a wafer with a liquid cleaning solution, residual liquid cleaning solution within a dispensing instrument may drip upon an underlying wafer after the desired application of the liquid cleaning solution. This residual liquid cleaning solution may be liquid cleaning solution that remains within conduits or within the cleaning nozzle itself after a liquid source is disconnected from the cleaning nozzle. The deposition of the residual liquid cleaning solution upon a wafer being transported within the cleaning chamber may cause undesirable damage or exposure of the transported wafer (e.g., due to exposure of the liquid cleaning solution outside of the intended use environment of the liquid cleaning solution). Also, the dispensed liquid and/or gas from the dispensing instrument may damage the wafer over time due to the force at which the liquid and/or gas is dispensed.

Accordingly, the present disclosure provides various embodiments of a shuttered wafer cleaning system. The shuttered wafer cleaning system may include a shutter which may be disposed under a cleaning nozzle to intercept residual liquid droplets from falling onto a wafer or other objects below. In certain embodiments, the shutter may be liquid impermeable, but may allow gas to flow around the shutter to clean and/or dry a wafer. Also, the shutter may be configurable between at least an on coverage position and an off coverage position. At the on coverage position, the shutter may intercept residual liquid that may drip from the cleaning nozzle when the cleaning nozzle is not configured to actively dispense liquid onto the wafer. Typically, the on coverage position is directly below the cleaning nozzle, so as to intercept falling liquid droplets from the cleaning nozzle. At the off coverage position, the shutter may be away from the cleaning nozzle to not interfere with liquid or gas dispensed from the cleaning nozzle. Typically, the off coverage position is not directly below the cleaning nozzle.

The cleaning nozzle may be configured to dispense cleaning liquids and/or gases toward a wafer. In various embodiments, the cleaning nozzle may be in fluid communication with various lines, that form a conduit, and valves that connect the cleaning nozzle with at least one liquid and/or gas source. The valves may be modified (e.g., opened or closed) to connect the cleaning nozzle with at least one liquid and/or gas source. Accordingly, the cleaning nozzle may be active when connected with the at least one liquid and/or gas source and inactive when not connected with the at least one liquid and/or gas source via operation of the valve.

In certain embodiments, the wafer may be configured to be spun while liquid and/or gas is dispensed upon the wafer in the course of cleaning the wafer (e.g., in the course of spin cleaning). More specifically, a wafer support may secure the wafer and spin around an axis of rotation, thus also spinning the wafer. To better equalize and stabilize the air pressure above the spinning wafer, a rotational ring may laterally surround the nozzle to spin at a same rotational speed as the spinning wafer. The rotational ring may have a substantially same outer circumference and diameter as a wafer secured to the wafer support and spun by the wafer support. Stated another way, the rotational ring may have an outer circumference and diameter that is substantially the same as specified for a wafer configured to be secured to the wafer support and spun by the wafer support.

The shutter may be moved by a shutter actuator between the on coverage position and the off coverage position. For example, the shutter actuator may include a motor that moves the shutter between the on coverage position and the off coverage position with an angular or horizontal motion. In certain embodiments, the shutter and the shutter actuator may be coupled to the rotational ring and thus spin with the rotational ring. In other embodiments, the shutter and the shutter actuator may be outside of the rotational ring and not spin or move with the rotational ring. In certain embodiments, the shutter actuator may move the shutter to the on coverage position in response to the cleaning nozzle being inactive or in an inactive state (e.g., when the cleaning nozzle is not actively dispensing gas or liquid for wafer cleaning). Also, the shutter actuator may move the shutter to the off coverage position in response to the cleaning nozzle being active or in an active state (e.g., when the cleaning nozzle is actively dispensing gas or liquid for wafer cleaning). As will be discussed further below, a processor may coordinate communications and control between the valve that controls whether the nozzle is in an active or inactive state and the shutter actuator that moves the shutter in an on coverage position and an off coverage position.

As noted above, the shutter may be liquid impermeable, but may allow gas to flow around the shutter to clean and/or dry a wafer in an on coverage position. Accordingly, the shutter may include an amount of vertical clearance under the cleaning nozzle so that residual liquid may drip from the cleaning nozzle to be captured or intercepted by the shutter, but so that gas dispensed from the cleaning nozzle can reach the underlying wafer. However, in particular embodiments, the shutter may abut and cover the cleaning nozzle so as to seal the cleaning nozzle from any liquid or gas exiting the cleaning nozzle when the shutter is in an on coverage position.

In particular embodiments, the shutter may have a shutter support that helps support the shutter while in the on coverage and/or off coverage position. Specifically, the shutter may be moved by a shutter actuator between the on coverage and off coverage positions from one end of the shutter. A shutter support may be configured to support the shutter at the other end of the shutter (e.g., not an end of the shutter connected with the shutter actuator) when the shutter is at the on coverage and/or off coverage position.

In various embodiments, the shuttered wafer cleaning system may be configured to purge liquid that accumulates on the shutter. The liquid may be purged by gas dispensing from the nozzle at a predetermined purge force (e.g., pressure per unit area) that is the same or greater than a force of gas utilized for cleaning the wafer. Also, the shuttered wafer cleaning system may be configured to purge the liquid that accumulates on the shutter when an underlying wafer is removed (e.g., moved away from a wafer support directly below the shutter in an on coverage position.

FIG. 1 is a side view diagram of a shuttered wafer cleaning system 102, in accordance with some embodiments. The shuttered wafer cleaning system may include a dispensing instrument 104 configured to dispense liquid (e.g., liquid cleaning solution) and gas from a cleaning nozzle 106. The liquid and gas may be from a liquid and gas source 108 (e.g., one or more tanks of gas and/or liquid) that may be in fluid communication with the cleaning nozzle 106 via a conduit 110. The conduit 110 may represent a body of individual lines with the cleaning nozzle 106 for each respective liquid and gas and/or may have combined lines that combine sever liquids and/or gases together for dispensation at the cleaning nozzle 106. The individual lines of the conduit 110 may be controlled by a valve 112 configured to either open or close the individual lines of the conduit. More specifically, a valve 112 may be configured to open an individual line to put the cleaning nozzle 106 in fluid communication with the liquid and gas source 108 or may be configured to close an individual line to put the cleaning nozzle 106 out of fluid communication with a particular tank of the liquid and gas source. Accordingly, the cleaning nozzle (e.g., a particular portal 106A, 106B, 106C of the cleaning nozzle) may be deemed to be in an active state for a particular portal 106A, 106B, 106C when the particular portal 106A, 106B, 106C is in fluid communication with a respective liquid and gas source 108 and in an inactive state when the particular portal 106A, 106B, 106C is not in fluid communication with the liquid and gas source 108 in virtue of the valve 112. In certain embodiments, the valve 112 may represent a pressure control apparatus configured to control the amount and pressure (e.g., pressure level) of the liquid and/or gas dispensed by the cleaning nozzle 106. Also, the valve 112 may also represent a switch that controls which line is connected to which tank or source of liquid or gas.

The conduit 110 may terminate at the cleaning nozzle 106. More specifically, the conduit 110 may include different lines that terminate at different portals 106A, 106B, 106C within the cleaning nozzle. For example, a first portal 106A of the cleaning nozzle 106 may be configured to dispense a gas, and thus be in fluid communication with a gas tank of the liquid and gas source 108 when the first portal 106A of the cleaning nozzle 106 is in an active state. Also, a second portal 106B of the cleaning nozzle 106 may be configured to dispense another gas, and thus be in fluid communication with another gas tank of the liquid and gas source 108 when the second portal 106B of the cleaning nozzle 106 is in an active state. Furthermore, a third portal 106C of the cleaning nozzle 106 may be configured to dispense a liquid, and thus be in fluid communication with a liquid tank of the liquid and gas source 108 when the third portal 106C of the cleaning nozzle 106 is in an active state. In certain embodiments, the first portal 106A may surround the second portal 106B and the third portal 106C, as will be discussed and illustrated further below. Again, reference to an active state associated with the nozzle 106 may refer more specifically to whether a particular portal 106A, 106B, 106C is in fluid communication with its respective tank of liquid or gas from the liquid and gas source 108 via the valve 112. In certain embodiments, the valve 112 may represent a combination of collocated or disparate individual valves associated with different lines connected with different portals 106A, 106B, 106C.

A wafer 120 may be deposited on a wafer support 122. The wafer may be deposited by a robotic arm (not illustrated) that moves the wafer over the wafer support and deposits the wafer onto the wafer support. For example, the robotic arm may move the wafer over the wafer support and then lower the wafer so that the wafer rests on the wafer support and not the robotic arm. This may be accomplished by moving (e.g., lowering) the robotic arm to be within a clearance 124 under the wafer 120. Then, the robotic arm may be retracted out of the clearance. Once deposited on the wafer support 122, the wafer support 122 may secure the wafer 120 on the wafer support 122. The wafer 120 may be secured in any of a variety of manners, such as by clamping onto the extremities of the wafer 120 (e.g., an upper surface 126A of the wafer and/or a lower surface 126B of the wafer 120 adjacent to an extreme end 126C of the wafer, and the extreme end 126C of the wafer). Certain embodiments may secure the wafer 120 by clamping onto the extreme end 126C of the wafer and the lower surface 126B of the wafer 126. In various embodiments (not illustrated), the wafer support 122 may secure the wafer 126 on the wafer support 122 by clamping onto both the upper surface 126A and lower surface 126B of the wafer 120 around the extremities of the wafer 126. In certain embodiments, the wafer support 122 may include elastomeric pads on posts to hold the wafer 126 in place by gravity.

The wafer support 122 may be supported (e.g., joined to or connected with) a pedestal 128 which may rotate and cause the wafer support 122 to rotate as well. As will be discussed further below, the wafer support 122 may be intermittent and thus may not completely surround the extremities of the wafer 120 (e.g., may not entirely surround the extreme end 126C of the wafer 126). Also, the wafer 120 held by the wafer support 122 may be parallel to and spaced-apart from the top surface of pedestal. The wafer support 122 can horizontally rotate or spin wafer 120 about its central axis. Additionally, the wafer 120 may be placed face up wherein the side of the wafer with patterns or features such as transistors faces towards the cleaning nozzle 106 for dispensing liquids (e.g., cleaning chemicals and rinsing water) and/or gases thereon. Also, the backside of the wafer 126 may face the pedestal 128. In various embodiments, the pedestal 128 may be supported by a pedestal support 129, which may be a structure that supports or surrounds the pedestal. For example, the pedestal support 129 may represent a housing or support structure for the pedestal 128.

During cleaning, liquid (e.g., cleaning chemicals and rinsing water) may be fed through the cleaning nozzle 106 to generate a spray or stream of droplets which form a liquid coating on the upper surface 126A of the wafer 120 while the wafer 120 is spun. As noted above, tanks that are part of the liquid and gas source 108 of the dispensing instrument 104 may be coupled to a conduit 110 which feeds the cleaning nozzle 106. Liquid within the tanks may be utilized to produce the liquid utilized to clean the wafer as ejected from the cleaning nozzle 106. The liquid utilized to clean the wafer 120 may include, for example: a piranha solution of sulfuric acid ($H_2SO_4$) and hydrogen peroxide ($H_2O_2$); an ammonia-peroxide mixture (APM) comprising ammonium hydroxide ($NH_4OH$) and water ($H_2O$); a hydrochloric peroxide mixture (HPM) comprising hydrochloric acid (HCL) and hydrogen peroxide ($H_2O_2$); hydrogen fluoride (HF); a ST-250 cleaning solution; ozone ($O_3$) and water ($H_2O$); phosphoric acid ($H_3PO_4$); tetramethylammonium hydroxide (TMAH); $CO_2$ and water ($H_2O$); water ($H_2O$); isopropyl alcohol (IPA); citric acid ($C_6H_8O_7$); nitric acid ($HNO_3$); acetic acid ($C_3COOH$); a phosphoric acid ($H_3PO_4$), nitric acid ($HNO_3$) and hydrogen fluoride (HF) mixture; and a nitric acid ($HNO_3$), acetic acid ($C_3COOH$), and phosphoric acid ($H_3PO_4$) mixture.

Additionally, during cleaning, gas may be fed through the cleaning nozzle 106 toward the upper surface 126A of the wafer 120 while the wafer 120 is spun. The gas may be dispensed from the cleaning nozzle 106 during rinsing steps of wafer cleaning. The gas utilized to clean the wafer 120 may include, for example, nitrogen ($N_2$) gas, ambient air, and/or isopropyl alcohol (IPA) vapor.

The wafer 120 may be rinsed using water (e.g., deionized water) after application of a liquid cleaning solution or cleaning chemical. In certain embodiments, the wafer 120 is both exposed to the liquid cleaning solution and the rinsing water (e.g., all liquids ejected by the cleaning nozzle 106) in-situ.

In particular embodiments, the dispensing instrument 104 may be moved vertically (e.g., lowered) so that the cleaning nozzle 106 is closer to the wafer. Also, the clearance 124 at which the wafer 120 is held from pedestal 128 by the wafer support 122 can be increased (e.g., by moving either the wafer support 122 or the pedestal 128).

In certain embodiments, the wafer 120 may be configured to be spun while liquid and/or gas is dispensed upon the wafer in the course of cleaning the wafer (e.g., in the course of spin cleaning). More specifically, the wafer support 122 may secure the wafer 120 and spin around an axis of rotation, thus also spinning the wafer 120. To better equalize the air pressure above the spinning wafer 120 and under the cleaning nozzle 106, the dispensing instrument 104 may include a nozzle shield with a rotational ring 132. The rotational ring 132 may laterally surround the cleaning nozzle 106 to spin at a same rotational speed and direction as the spinning wafer 120. The rotational ring 132 may have a substantially same outer circumference and diameter as the wafer 120 configured to be secured to the wafer support 122 and spun by the wafer support 122. Stated another way, the rotational ring 132 may have an outer circumference and diameter that is substantially the same as specified for the wafer 120 configured to be secured to the wafer support 122 and spun by the wafer support 122. Also, the nozzle shield 130 may reduce the amount of liquid ejected onto the wafer from the cleaning nozzle 106 that splashes off of the wafer 120.

A shutter 140 may be disposed under the cleaning nozzle 106 to intercept residual liquid droplets from falling onto the wafer 120 or other objects below the cleaning nozzle 106. As noted above, the deposition of the residual liquid upon the wafer 120 may cause undesirable damage or exposure of the wafer 120 (e.g., due to exposure of a liquid cleaning solution outside of the intended use environment of the liquid cleaning solution). In certain embodiments, the shutter 140 may be liquid impermeable, but may allow gas dispensed from the cleaning nozzle 106 to flow around the shutter 140 to clean and/or dry the wafer 120. Furthermore, the shutter may reduce an amount of force (e.g., pressure per unit area) felt by the wafer 120 when gas is dispensed by the cleaning nozzle 106.

In various embodiments, the shutter 140 may be made of a water resistant or waterproof material (e.g., be liquid impermeable). For example, the shutter may be made of a solid material such as a metal or a ceramic. Also, the shutter 140 may have a sufficient amount of clearance from the cleaning nozzle 106 such that any perturbations of the shutter due to movement of the shutter itself or, more generally, the liquid and gas source 108 may not cause the shutter 140 to incur damage via physical contact with another structure. For example, the shutter may have a clearance of about 1 millimeter to about 10 centimeters in certain embodiments. In further embodiments, the shutter may have sufficient thickness to be generally rigid during operation (e.g., to not bend or deform during movement). For example, the shutter may be from 0.1 millimeters to about 10 millimeters in cross sectional thickness.

The shutter 140 may be configurable between an on coverage position 140A and an off coverage position 140B. For case of illustration, the shutter 140 in the on coverage position 140A is illustrated with solid lines and the shutter 140 in the off coverage position 140B is illustrated with dotted lines. At the on coverage position, the shutter may intercept residual liquid that may drip from the cleaning nozzle when the cleaning nozzle is not configured to actively dispense liquid onto the wafer (e.g., when a particular portal of the nozzle is not in fluid communication with a liquid and gas source 108 via the conduit 110 and valve 112). The on coverage position 140A is directly below the cleaning nozzle 106, so as to intercept falling liquid droplets from the cleaning nozzle 106. At the off coverage position 140B, the shutter 140 may be away from the cleaning nozzle 106 to not interfere with liquid or gas dispensed from the cleaning nozzle 106. The shutter 140 in the off coverage position 140B is not directly below the cleaning nozzle 106.

In certain embodiments, the shutter 140 is in the on coverage position 140A when the cleaning nozzle 106 is not configured to actively dispense liquid and is not configured to actively dispense gas from the cleaning nozzle 106. Stated another way, in certain embodiments, the shutter 140 is in the off coverage position 140B when the cleaning nozzle 106 is configured to actively dispense liquid and is not configured to actively dispense gas from the cleaning nozzle 106.

In other embodiments, the shutter 140 is in the on coverage position 140A when the cleaning nozzle 106 is not configured to actively dispense liquid but is configured to actively dispense gas from the cleaning nozzle 106. Also, the shutter 140 may be in the off coverage position 140B when the cleaning nozzle 106 is configured to not actively dispense liquid but is configured to actively dispense gas form the cleaning nozzle 106. As noted above, active dispensing refers to dispensing of liquid or gas at a portal of the cleaning nozzle 106 via a valve that is not closed.

The shutter 140 may be moved by a shutter actuator 144 between the on coverage position 140A and the off coverage position 140B. For example, the shutter actuator 144 may include a motor that moves the shutter 140 between the on coverage position and the off coverage position with an angular or horizontal motion. In certain embodiments, the shutter 140 and the shutter actuator 144 may be coupled to the rotational ring 132 and thus spin with the rotational ring 132, as illustrated in FIG. 1. For example, the shutter actuator may be within the body of the dispensing instrument 104, such as embedded within the rotational ring 132 and/or within the nozzle shield 130. In other embodiments that will be illustrated below, the shutter and the shutter actuator may be outside of the rotational ring 132 and not spin or move with the rotational ring 132. In such embodiments, the shutter actuator may be connected with the shutter 140 via a shutter actuator support 145. In other embodiments, the shutter actuator 144 may be external to the nozzle shield 130, such as by being connected to the nozzle shield via the shutter actuator support 145.

As noted above, the shutter 140 may be liquid impermeable and may allow gas to flow around the shutter 140 to clean and/or dry the wafer 120 in the on coverage position 140A. Accordingly, the shutter 140 (e.g., the shutter in the on coverage position 140A) may include an amount of vertical clearance 141 under the cleaning nozzle 106 so that residual liquid may drip from the cleaning nozzle 106 to be captured or intercepted by the shutter 140 and so that gas dispensed from the cleaning nozzle 106 can reach the underlying wafer 120.

Figure 2A:
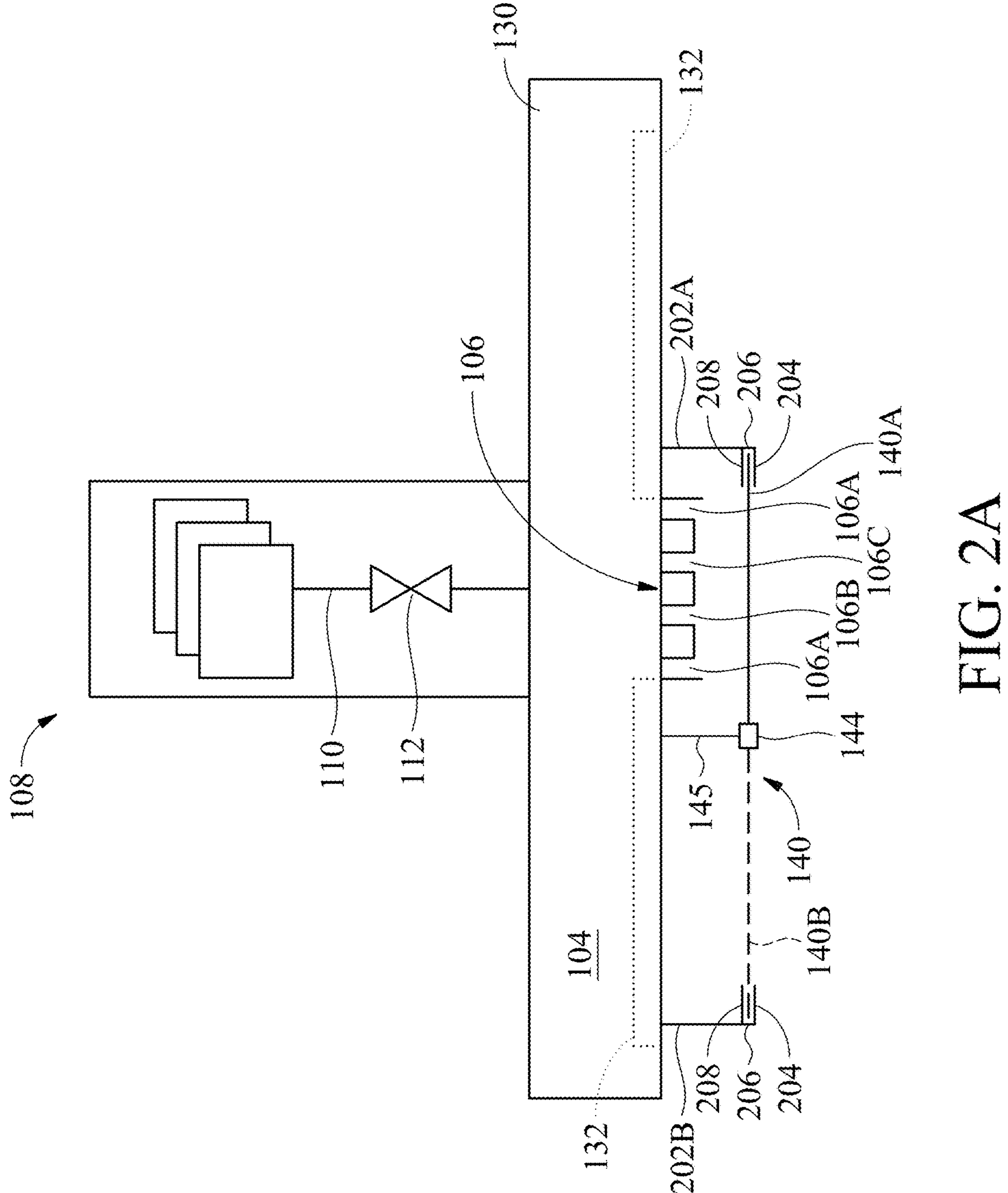
FIG. 2A is a side view diagram of shutter supports, in accordance with some embodiments.

FIG. 2A is a diagram of shutter supports 202A, 202B, in accordance with some embodiments. The shutter supports 202A, 202B may help support the shutter while the shutter is in either the on coverage position 140A or the off coverage position 140B. The shutter 140 may be moved by the shutter actuator 144 between the on coverage position 140A and the off coverage position 140B from one end of the shutter. The shutter supports 202A, 202B may be configured to support the shutter 140 at the other end of the shutter (e.g., the end of the shutter not connected with the shutter actuator 144) when the shutter 140 is at the on coverage position 140A or the off coverage position 140B. Specifically, the on coverage position shutter support 202A may support the shutter 140 in the on coverage position 140A. Also, the off coverage position shutter support 202B may support the shutter 140 in the off coverage position 140B.

In various embodiments, the shutter support 202A, 202B may include a bottom support surface 204 that the shutter 140 may rest upon when in either the on coverage position 140A or the off coverage position 140B. By resting on the bottom support surface 202, the shutter actuator needs not bear the full weight and burden of supporting the shutter 140. Also, the shutter support 202A, 202B may include a lateral support surface 206 and a top support surface 208 to better orient and secure the shutter 140 within the shutter support 202A, 202B.

Figure 2B:
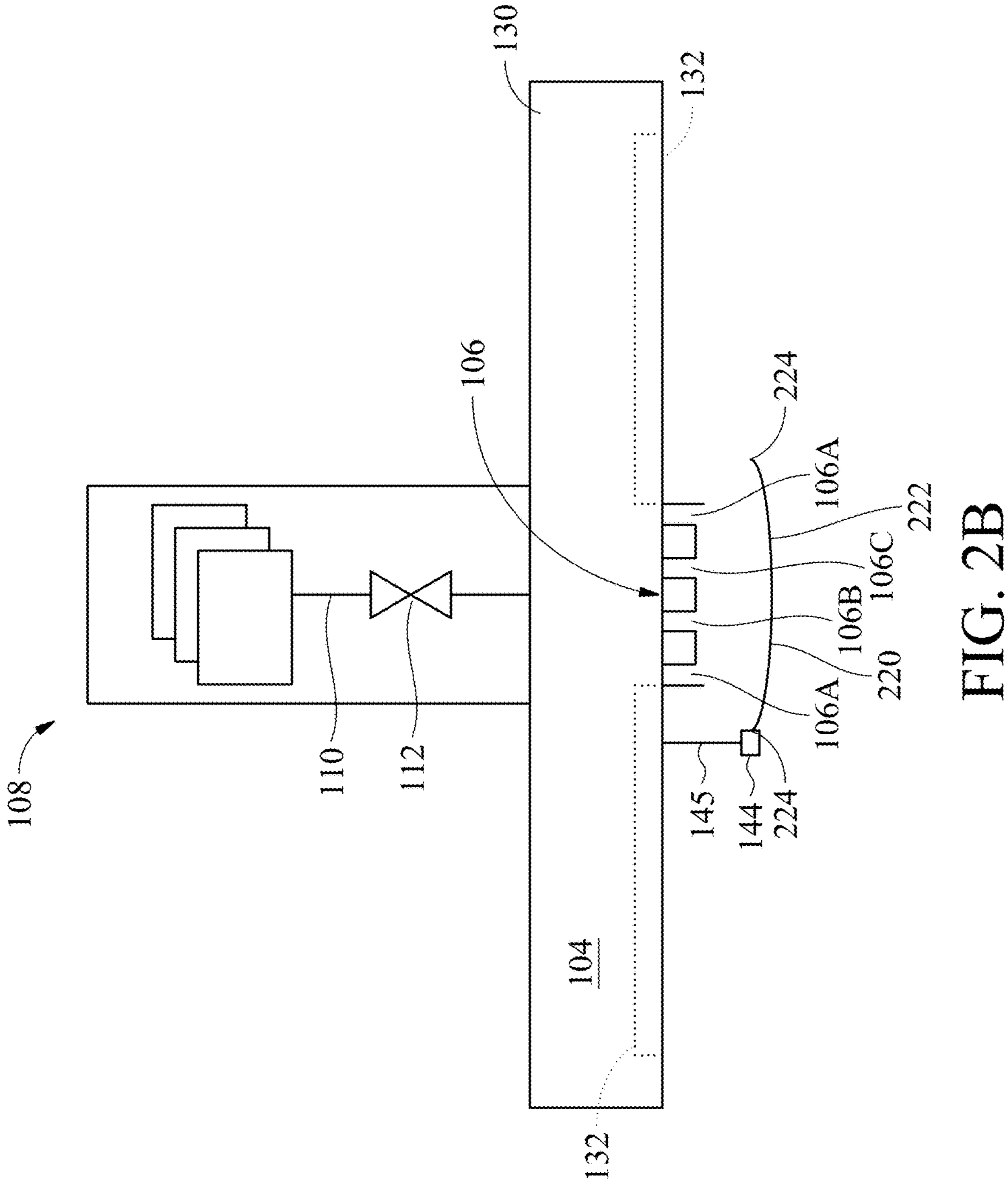
FIG. 2B is a side view diagram of a concave shutter, in accordance with some embodiments.

FIG. 2B is a diagram of a concave shutter 220, in accordance with some embodiments. The concave shutter 220 may be similar to the shutter 140 of FIG. 1, except that the concave shutter 220 includes a concavity as part of the shape of the concave shutter 220. This concavity may be from the perspective of the cleaning nozzle 106 (e.g., concavity facing the cleaning nozzle 106). For example, the concave shutter 220 may include a lower valley 222 that is surrounded by higher peak edges 224 close to the circumference or ends of the concave shutter 220. Also, the concave shutter 220 may have a diameter that is at or greater than a diameter of the cleaning nozzle 106.

Accordingly, the concave shutter 220 may be disposed under the cleaning nozzle 106 to intercept residual liquid droplets from falling onto the wafer or other objects below the cleaning nozzle 106. Due to the concave shape of the concave shutter 220, the liquid droplets may pool at the lower valley 222 and be less prone to spilling over the higher peak edges 224 than without the concavity (e.g., than if the concave shutter 220 were flat and without a concavity).

Figure 2C:
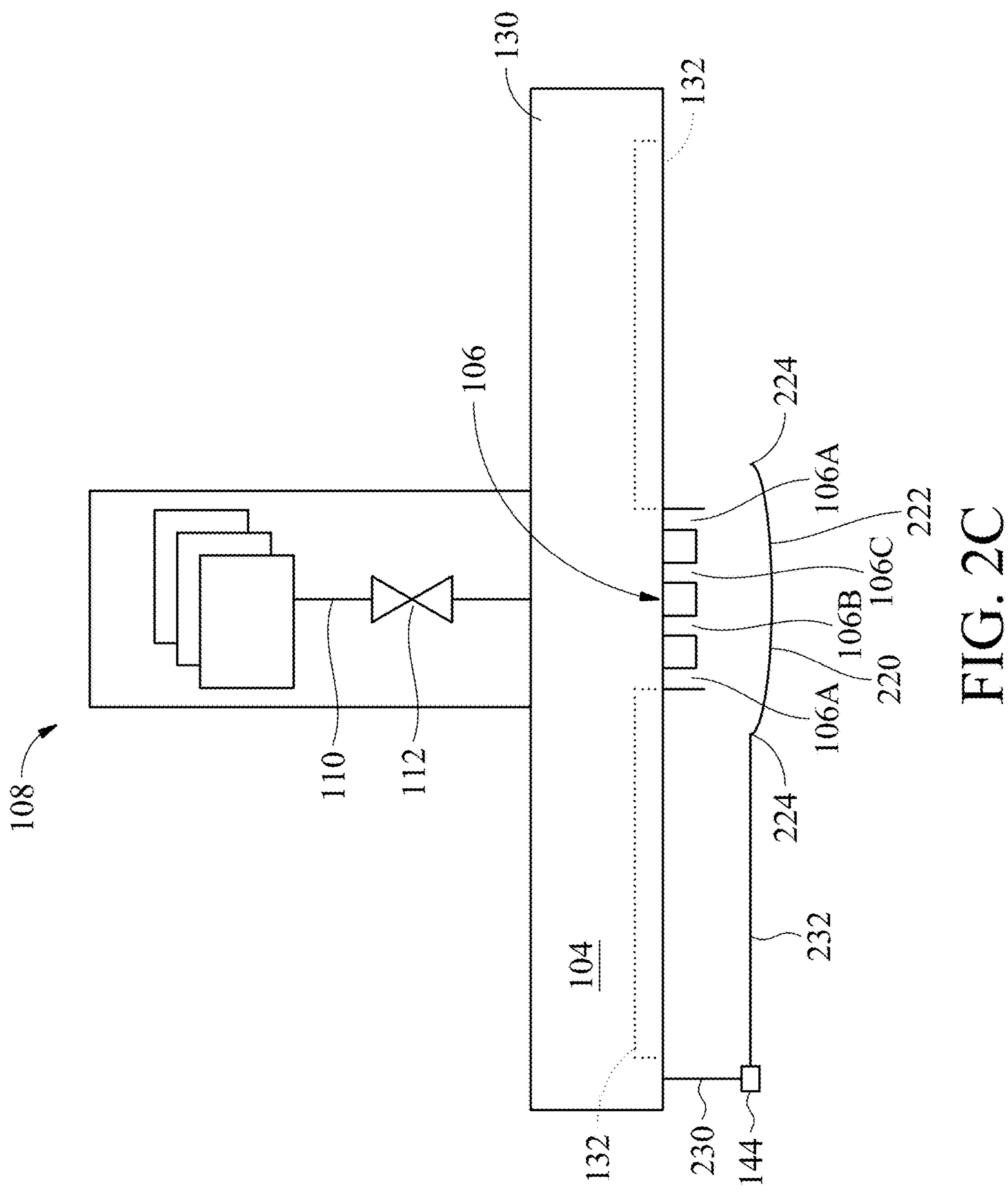
FIG. 2C is a side view diagram of an immobile shutter base, in accordance with some embodiments.

FIG. 2C is a diagram of an immobile shutter actuator support 230, in accordance with some embodiments. The immobile shutter actuator support 230 may refer to a shutter actuator support that is not connected with the rotational ring 132 and thus does not rotate with the rotational ring 132. Rather, the immobile shutter actuator support 230 is connected to a portion of the nozzle shield 130 that does not move with the rotational ring 132. Also, a shutter extension 232 may connect a shutter (e.g., the concave shutter 220) with the shutter actuator 144. In certain embodiments, the shutter extension 232 may have less width than a corresponding width or diameter of the shutter (e.g., the concave shutter 220) that the shutter extension 232 is connected with.

Figure 2D:
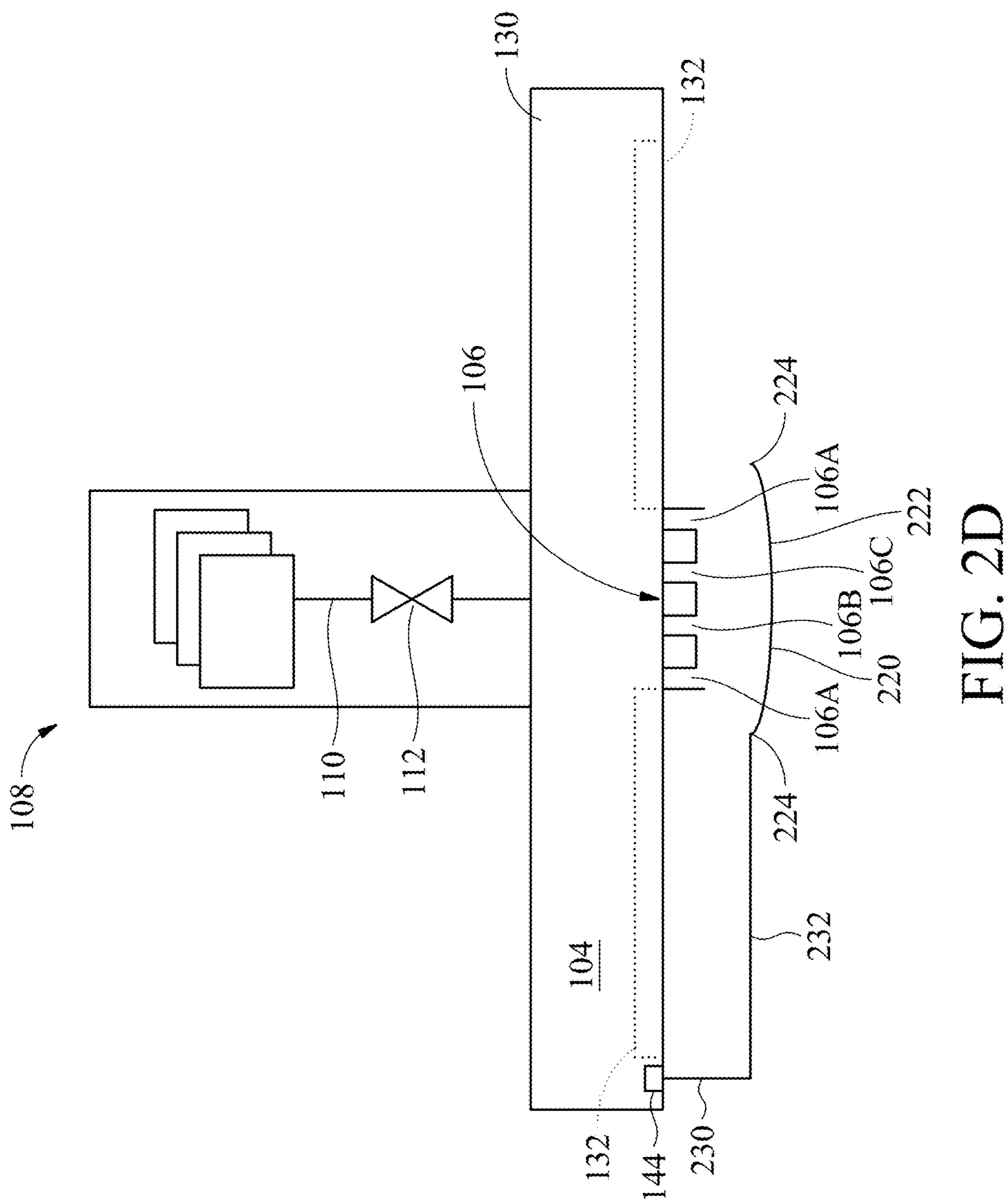
FIG. 2D is a side view diagram of a shutter actuator embedded within the nozzle shield, in accordance with some embodiments.

FIG. 2D is a diagram of a shutter actuator 144 embedded within the nozzle shield 130, in accordance with some embodiments. Accordingly, the shutter actuator 144 is not connected with the nozzle shield 130 via a shutter actuator support (e.g., the immobile shutter actuator support 230) but is directly connected with the nozzle shield 130. Similar to the above discussion of the shutter actuator, the shutter actuator 144 may be configured move the shutter between an on coverage position and an off coverage position. However, the shutter actuator 144 may move the shutter actuator support (e.g., the immobile shutter actuator support 230) in order to move the shutter between the two positions when embedded within the nozzle shield 130.

Figure 2E:
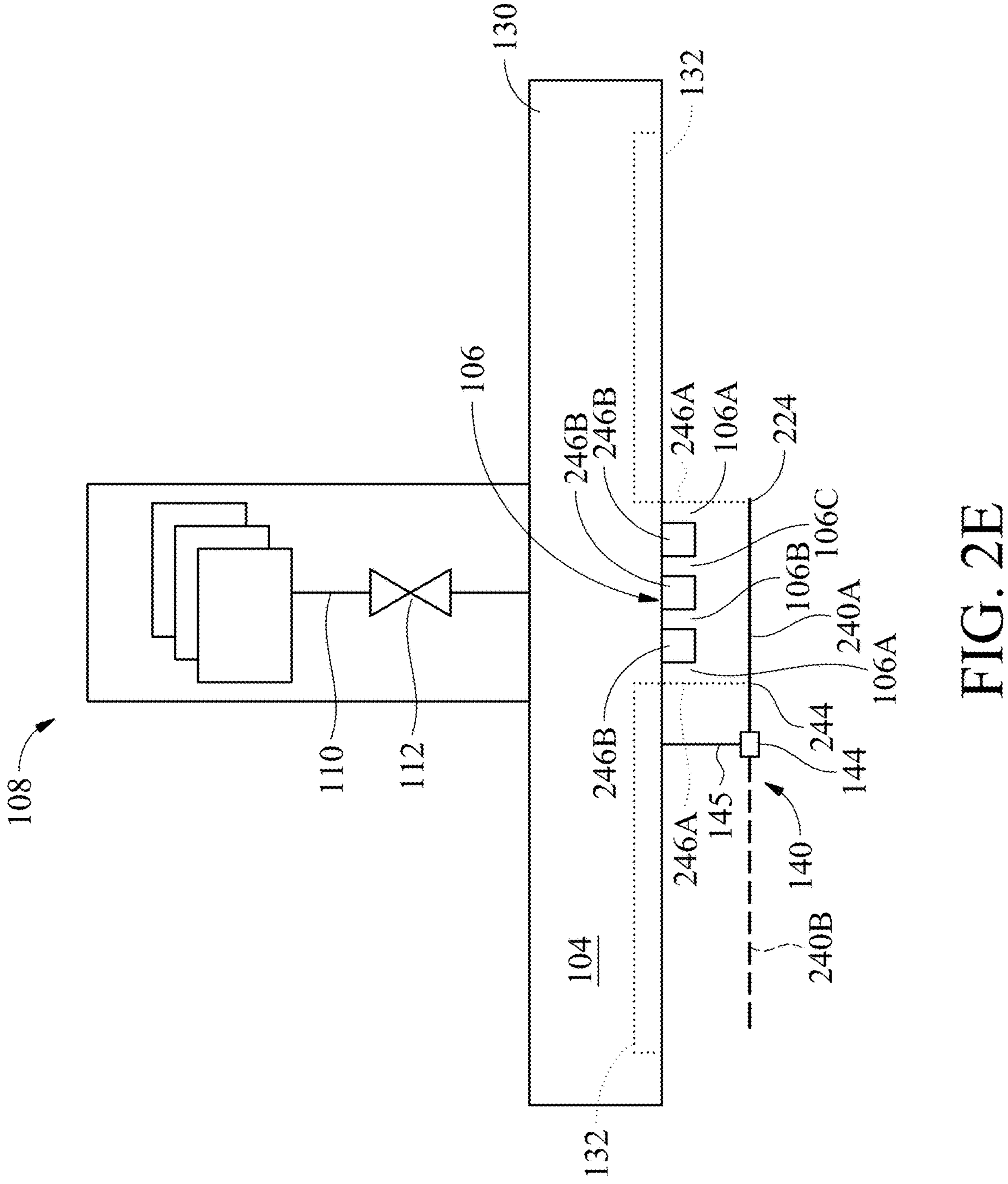
FIG. 2E is a side view diagram of an abutting shutter, in accordance with some embodiments.

FIG. 2E is a diagram of an abutting shutter 240, in accordance with some embodiments. The abutting shutter 240 may be similar to the shutter 140 in FIGS. 1 and 2A above, except that the abutting shutter 240 of FIG. 2E contacts the cleaning nozzle 106 (e.g., at contact point 244). Accordingly, the abutting shutter 240 may abut and cover the cleaning nozzle 106 so as to seal the cleaning nozzle 106 from liquid or gas dispensed from the cleaning nozzle 106 when the shutter is in an on coverage position 240A. As noted above, the abutting shutter 240 may also assume an off coverage position 240B away from the on coverage position 240A. In certain embodiments, the abutting shutter 240 in the on coverage position 240A may contact and rotate with an outer ring 246A of the cleaning nozzle 106 and have clearance from (e.g., not contact) an inner portion 246B of the cleaning nozzle 106.

Figure 2F:
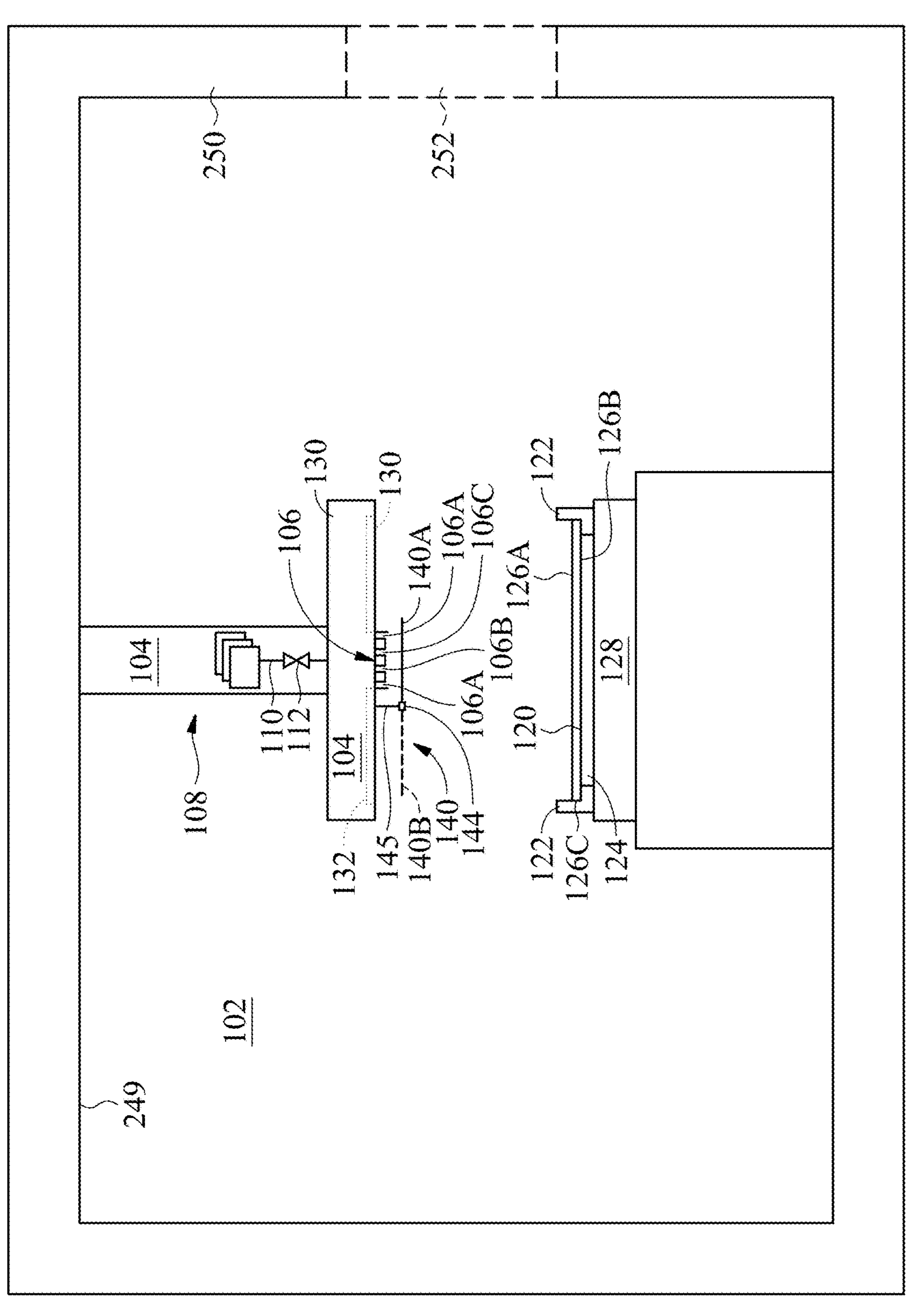
FIG. 2F is a side view diagram of a dispensing instrument extending from a ceiling, in accordance with some embodiments.

FIG. 2F is a diagram of the dispensing instrument 104 extending from a ceiling 249, in accordance with some embodiments. The shuttered wafer cleaning system 102 may be enclosed within a housing 250. The housing 250 may include a door 252 which may be opened for access between the interior and exterior of the housing 250. Also, the housing may have a ceiling 249 from which the dispensing instrument 104 is interfaced.

Figure 2G:
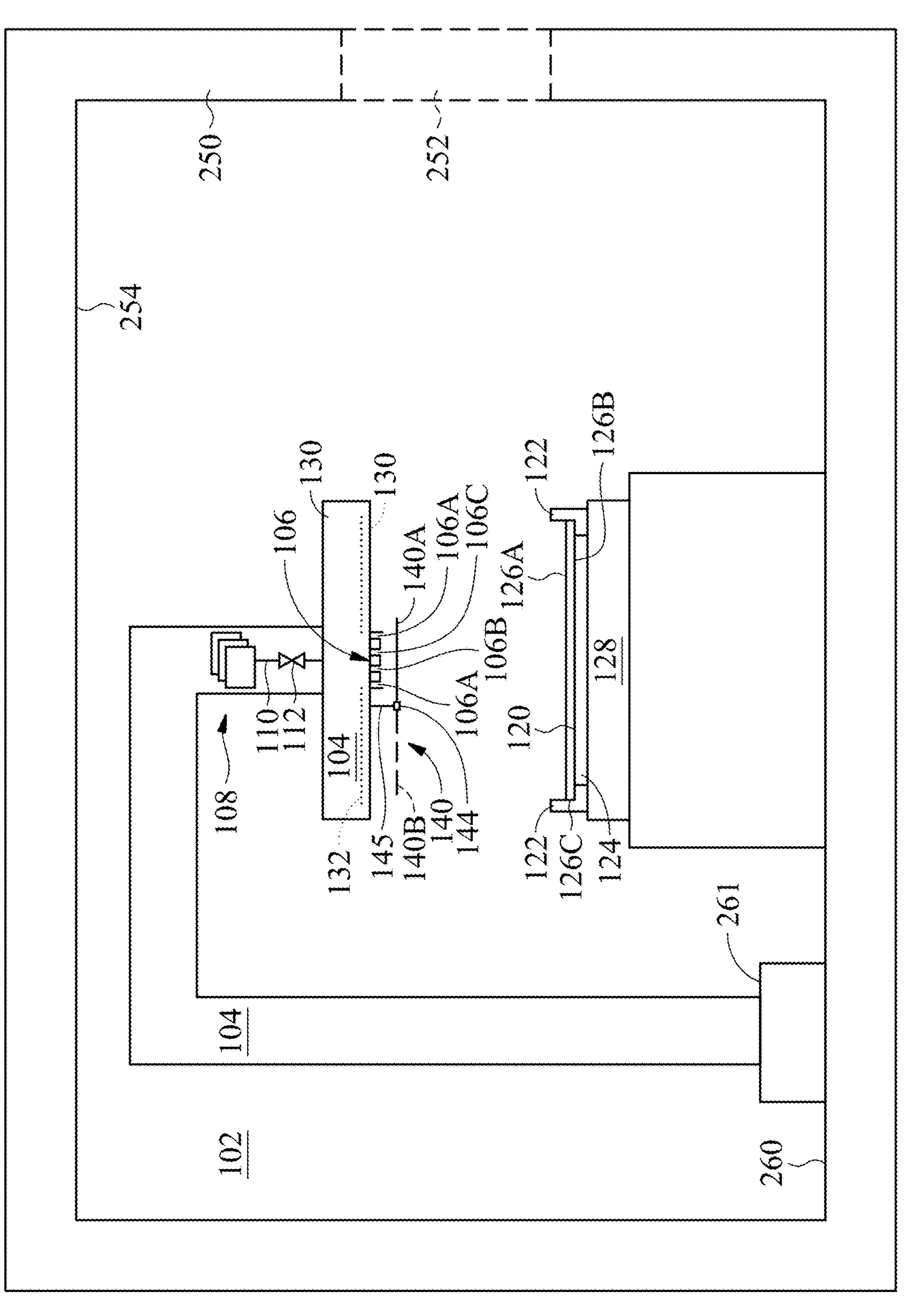
FIG. 2G is a side view diagram of a dispensing instrument extending from a floor, in accordance with some embodiments.

FIG. 2G is a diagram of the dispensing instrument 104 extending from a floor 260, in accordance with some embodiments. The shuttered wafer cleaning system 102 may be enclosed within the housing 250, which may include a floor 260. The dispensing instrument 104 may be interfaced (e.g., extend from) the floor 260, such as via a base 261 that secures the dispensing instrument 104 to the floor 260. In certain embodiments, the base 261 of the dispensing instrument 104 adjacent to the floor 260 may be movable such that the dispensing instrument 104 may be movable around the floor 260 of the housing 250.

Figure 3A:
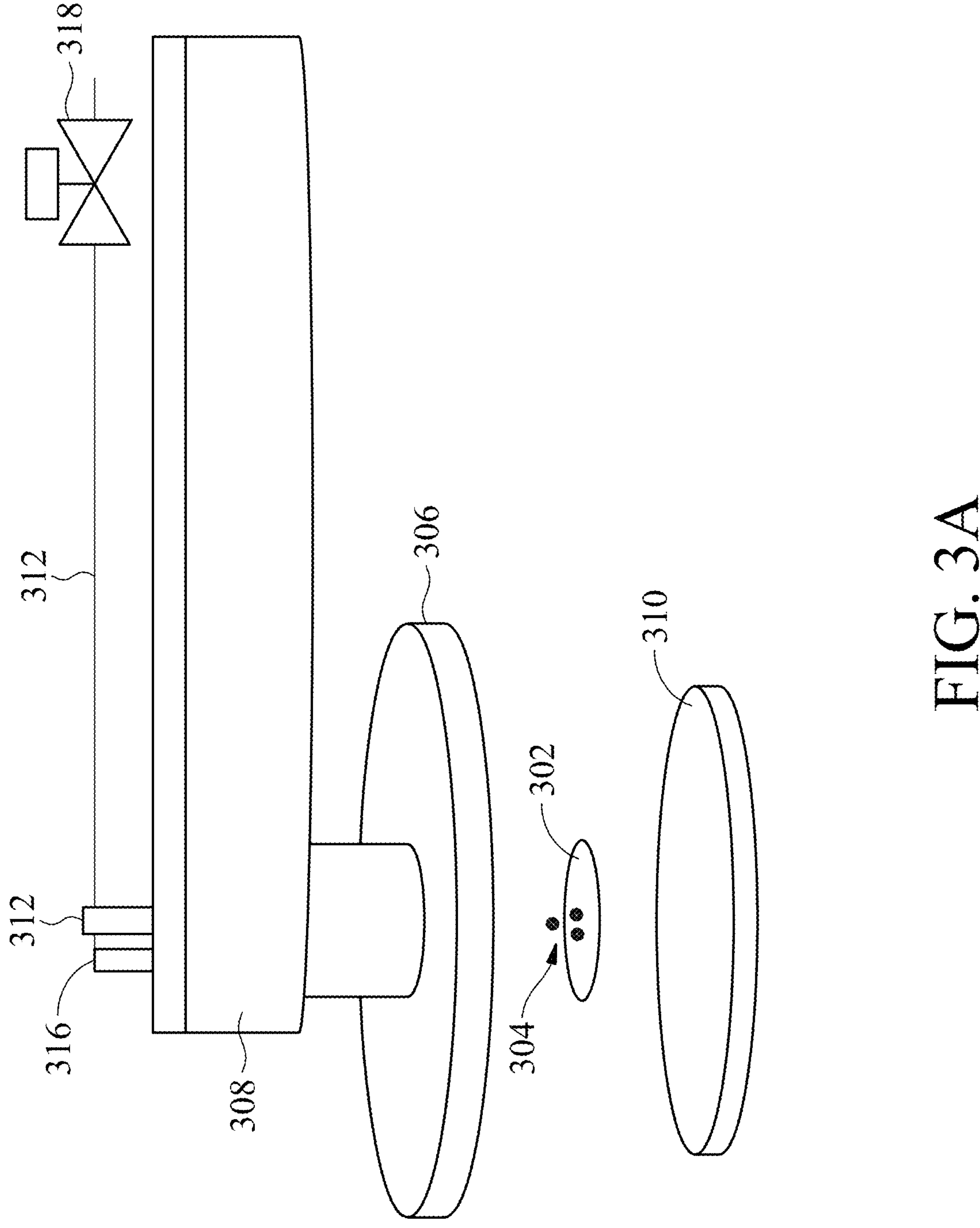
FIG. 3A is a diagram of a shutter catching dripping liquid, in accordance with some embodiments.

FIG. 3A is a diagram of a shutter 302 catching dripping liquid 304, in accordance with some embodiments. The shutter 302 may be interfaced with a shutter actuator, shutter actuator support, and/or a shutter extension as noted above not illustrated or discussed further in FIGS. 3A and 3B for brevity. Returning to FIG. 3A, the shutter 302 may be disposed in between a nozzle on a nozzle shield 306 of a dispensing instrument 308 and a wafer 310. More specifically, the shutter 302 may be directly below the nozzle to catch or intercept the droplets of liquid 304 as they fall from the nozzle at the nozzle shield 306. As discussed above, the shutter 302 may include a concave shape to hold the droplets of liquid 304 at the shutter. Furthermore, the liquid (e.g., droplets of liquid 304) from the nozzle may be fed by a liquid and gas source (not illustrated here but discussed further above). More specifically, the liquid (e.g., droplets of liquid 304) may be brought from the liquid and gas source via a liquid line 312 of a conduit that connects the nozzle with the liquid and gas source. Also, the gas may be brought from the liquid and gas source via a gas line 316 of the conduit that connects the nozzle with the liquid and gas source. The state of fluid communication between the nozzle and the liquid and gas source may be controlled by a valve 318, which may be closed to cut off the fluid communication and open to allow for fluid communication between the nozzle and the liquid and gas source.

Figure 3B:
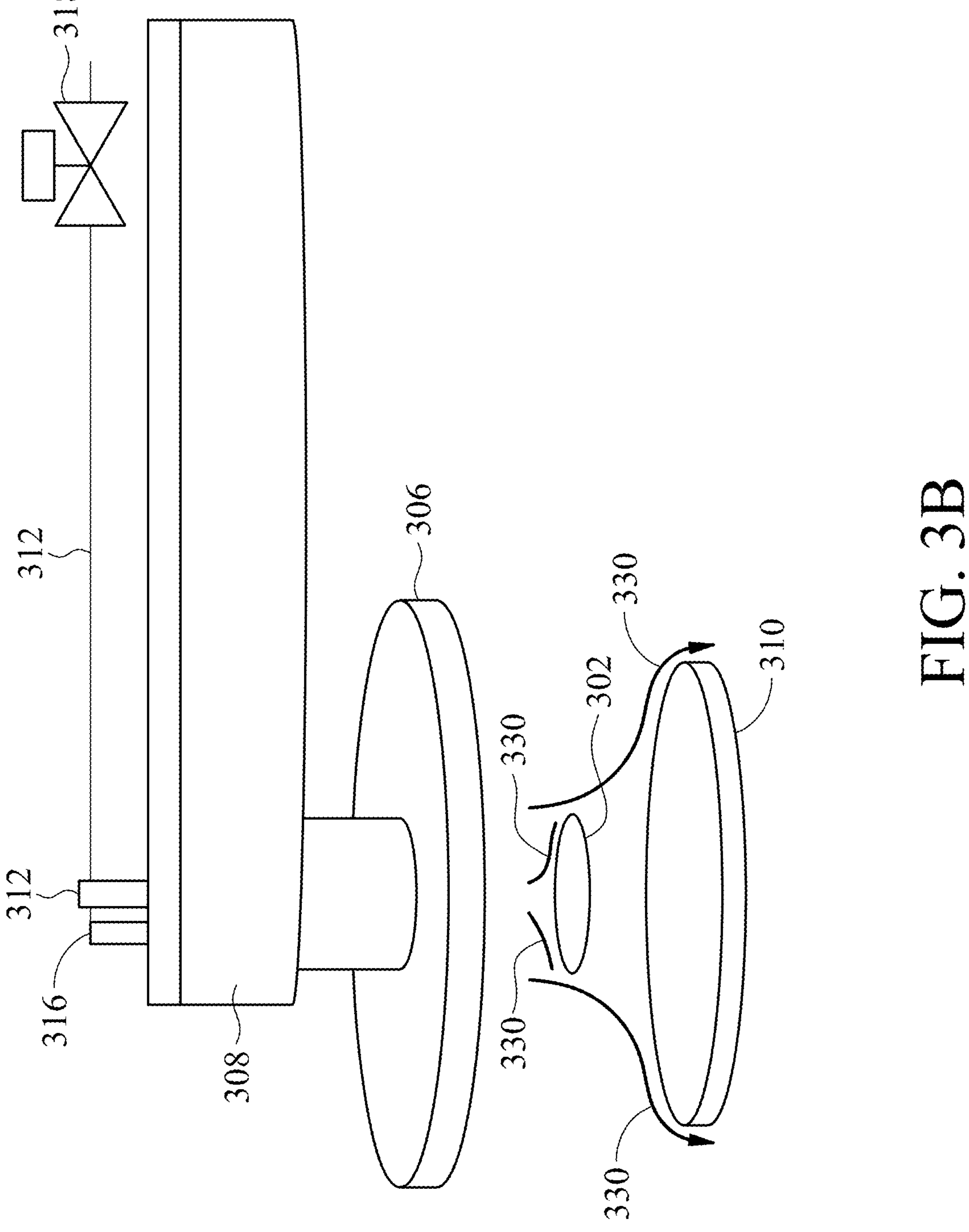
FIG. 3B is a diagram of a shutter redirecting gas, in accordance with some embodiments.

FIG. 3B is a diagram of a shutter redirecting gas 330, in accordance with some embodiments. The shutter 302 between the nozzle and the wafer may be configured to block a vertical path of gas 330 dispensed from the nozzle so that the gas does not directly impact the wafer 310 without first being redirected by the shutter 302 (e.g., by being deflected by the shutter 302). For example, the shutter may substantially extend in a direction generally orthogonal to the vertical path of the gas 330. Accordingly, the dispensed gas 330 may still reach the wafer 310, but though an indirect path. Advantageously, damage to the wafer 310 from the force of the dispensed gas 330 may be reduced when compared to operation without the shutter 302 in the on coverage position by blocking the direct flow of dispensed gas onto the wafer.

Figure 4A:
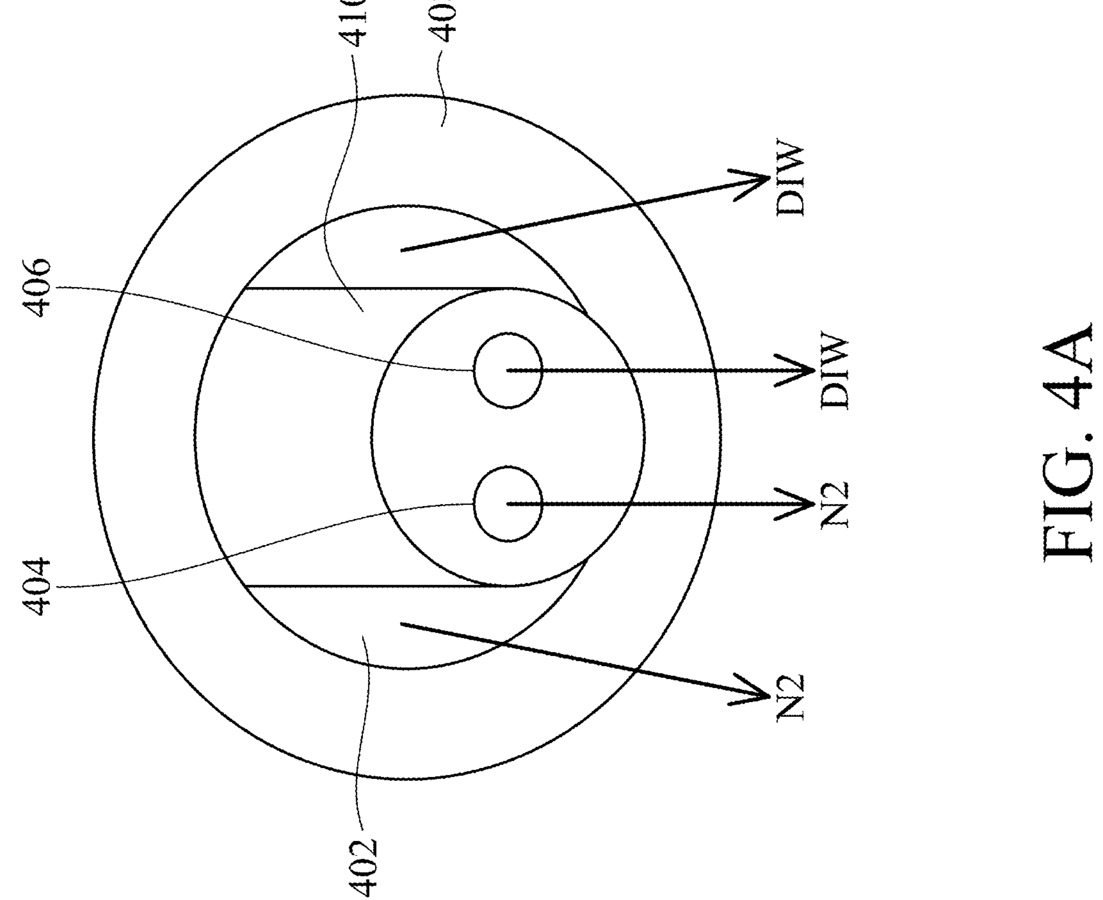
FIG. 4A is a diagram of a nozzle, in accordance with some embodiments.

FIG. 4A is a diagram of a cleaning nozzle 400, in accordance with some embodiments. A conduit that connects the cleaning nozzle 400 to a liquid and gas source may include different lines that terminate at different portals 402, 404, 406 within the cleaning nozzle 400. Specifically, a first portal 402 of the cleaning nozzle 400 may be configured to dispense a gas (e.g., $N_2$), and thus be in fluid communication with a gas tank of the liquid and gas source when the cleaning nozzle 400 is in an active state. As noted above, by being in an active state, a valve connected to the line between the first portal 402 and the liquid and gas tank may be open. Also, by being in an inactive state, the valve connected to the line between the first portal 402 and the liquid and gas tank may be closed.

Also, a second portal 404 of the cleaning nozzle 400 may be configured to dispense another gas (e.g., $N_2$), and thus be in fluid communication with a different gas tank of the liquid and gas source than the first portal 402 when the cleaning nozzle 106 is in an active state. Accordingly, the gas dispensed by the second portal 404 may be a same type of gas, but dispensed from a different gas tank of the liquid and gas source. As noted above, by being in an active state, a valve connected to the line between the second portal 404 and the liquid and gas tank may be open. Also, by being in an inactive state, the valve connected to the line between the second portal 404 and the liquid and gas tank may be closed.

Furthermore, a third portal 406 of the cleaning nozzle 400 may be configured to dispense a liquid (e.g., deionized water (DIW)), and thus be in fluid communication with a liquid tank of the liquid and gas source when the cleaning nozzle 400 is in an active state. As noted above, by being in an active state, a valve of the conduit connected to the line between the third portal 406 and the liquid and gas tank may be open. Also, by being in an inactive state, the valve of the conduit connected to the line between the third portal 406 and the liquid and gas tank may be closed.

In certain embodiments, the first portal 402 may surround the second portal 404 and the third portal 406. For example, the first portal may be enclosed by an outer ring 408 (e.g., outer wall) and an inner ring 410 (e.g., inner wall) of the cleaning nozzle 400. Also, the second portal 404 and the third portal 406 may be bound within the inner ring 410. In various embodiments, the outer ring 408 may rotate with a rotational ring of a nozzle shield while the inner ring does not rotate with the rotational ring of the nozzle shield.

Figure 4B:
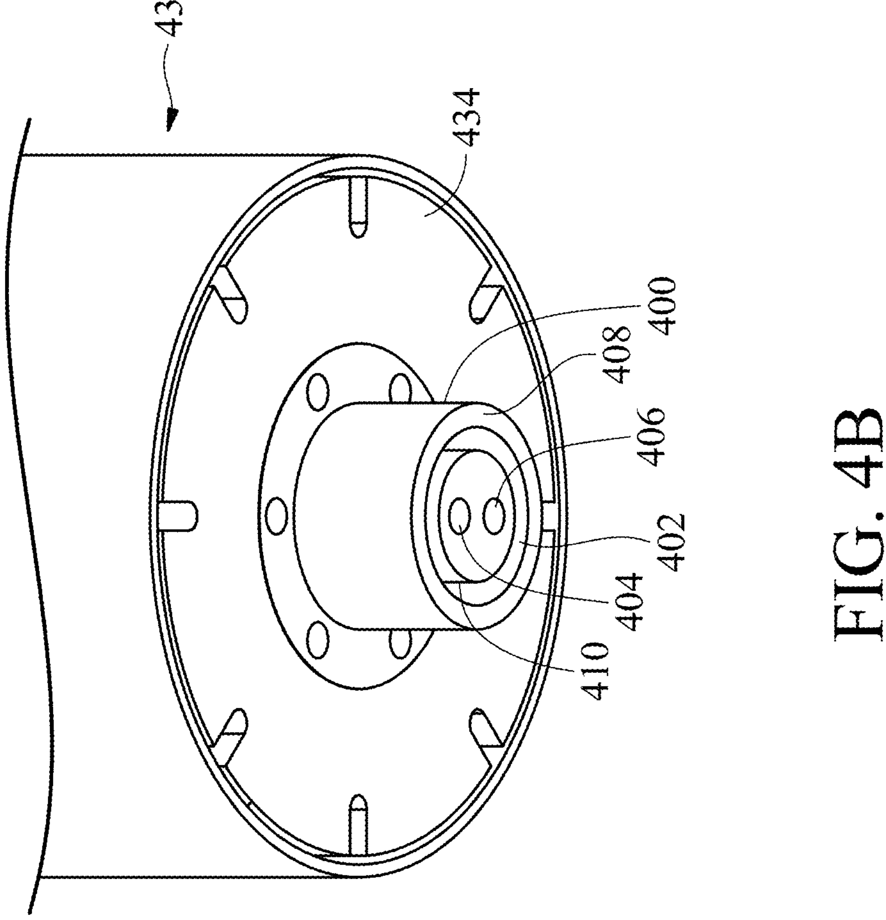
FIG. 4B is a diagram of a nozzle shield, in accordance with some embodiments.

FIG. 4B is a diagram of a nozzle shield 430, in accordance with some embodiments. The nozzle shield 430 may surround the cleaning nozzle 400 disposed at the center of the nozzle shield. As noted above, a wafer may be configured to be spun while liquid and/or gas is dispensed upon the wafer in the course of cleaning the wafer (e.g., in the course of spin cleaning). To better equalize the air pressure above a spinning wafer and under the cleaning nozzle 400, a dispensing instrument may include a nozzle shield 430 with a rotational ring 434. Accordingly, the nozzle shield may generally describe a housing for the rotational ring 434. The rotational ring 434 may laterally surround the cleaning nozzle 400 to spin at a same rotational speed and direction as the spinning wafer. The rotational ring may have a substantially same outer circumference and diameter as the wafer configured to be secured to the wafer support and spun by the wafer support. Stated another way, the rotational ring 434 may have an outer circumference and diameter that is substantially the same as specified for the wafer configured to be secured to the wafer support and spun by the wafer support. Also, the nozzle shield 130 may reduce the range of splashing or redirected liquid that bounces off of the wafer.

Figure 4C:
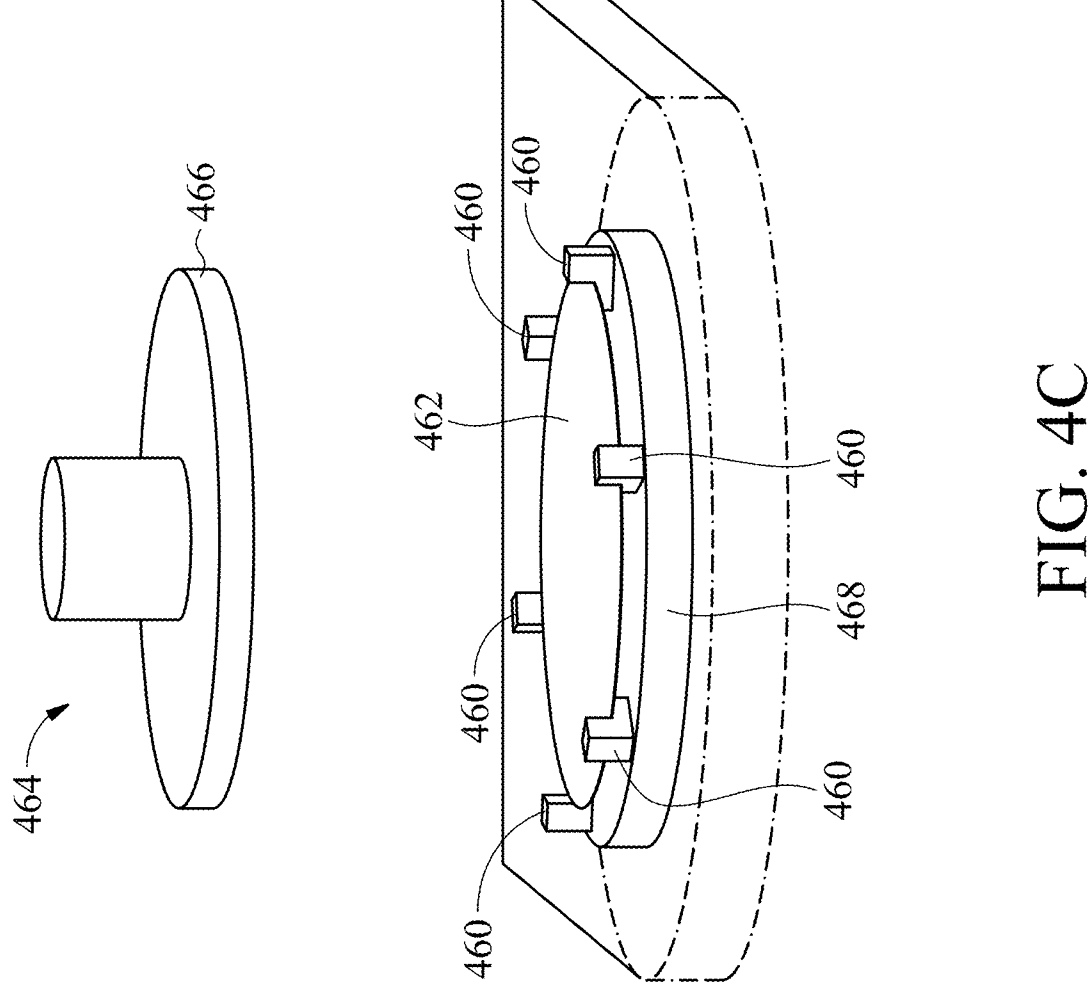
FIG. 4C is a diagram of a wafer support, in accordance with some embodiments.

FIG. 4C is a diagram of a wafer support 460, in accordance with some embodiments. A wafer 462 may be secured on the wafer support 460. The dispensing instrument 464 may include a nozzle shield 466 with a surface that faces the wafer 462. The wafer support 460 may be supported (e.g., joined to or connected with) a pedestal 468 which may rotate and cause the wafer support 460 to rotate as well. The wafer support 460 may be intermittent and thus may not completely surround the extremities of the wafer 462 (e.g., may not entirely surround the extreme end of the wafer 462). Also, the wafer 462 held by the wafer support 460 may be parallel to and spaced-apart from the top surface of the pedestal 468.

Figure 5:
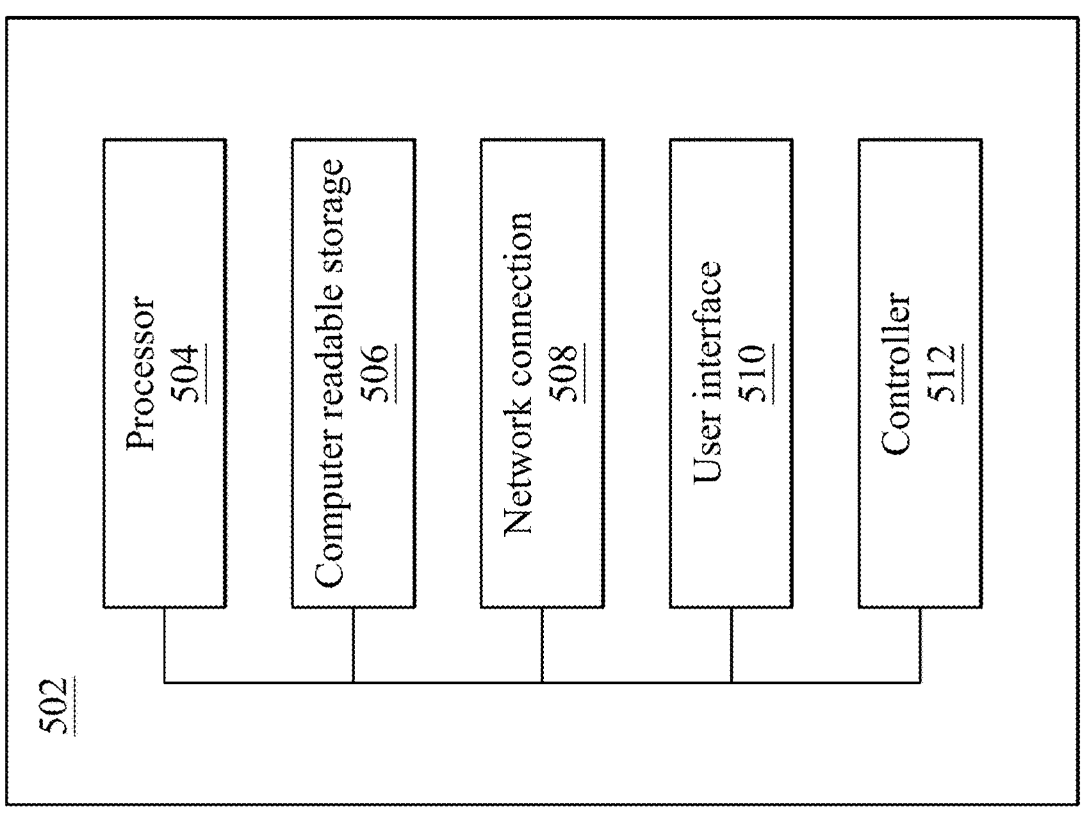
FIG. 5 is a block diagram of various functional modules of a shuttered wafer cleaning system, in accordance with some embodiment.

FIG. 5 is a block diagram of various functional modules of a shuttered wafer cleaning system 502, in accordance with some embodiments. These functional modules may be present in addition to the various features of a shuttered wafer cleaning system discussed above. The shuttered wafer cleaning system 502 may include a processor 504. In further embodiments, the processor 504 may be implemented as one or more processors.

The processor 504 may be operatively connected to a computer readable storage 506 (e.g., a memory and/or data store), a network connection 508, a user interface 510, and a controller 512. In some embodiments, the computer readable storage 506 may include process logic that may configure the processor 504 to perform the various processes discussed herein. The computer readable storage may also store data, such as operational instructions for a wet shutter cleaning process, operational instructions for dry shutter cleaning process, identifiers for a wafer, identifiers for a robotic arm, identifiers for a nozzle, identifiers for a portal, and any other parameter or information that may be utilized to perform the various processes discussed herein.

The network connection 508 may facilitate a network connection of the shuttered wafer cleaning system 502 with various devices and/or components of the shuttered wafer cleaning system 502 that may communicate within or external to the shuttered wafer cleaning system 502. In certain embodiments, the network connection 508 may facilitate a physical connection, such as a line or a bus. In other embodiments, the network connection 508 may facilitate a wireless connection, such as over a wireless local area network (WLAN) by using a transmitter, receiver, and/or transceiver. For example, the network connection 508 may facilitate a wireless or wired connection with the processor 504 and the controller 512. Also, the network connection 508 may enable communication between a valve and a shutter actuator, or between a wafer support and rotational ring, as moderated by the processor 504.

The shuttered wafer cleaning system 502 may also include a user interface 510. The user interface may include any type of interface for input and/or output to an operator of the shuttered wafer cleaning system 502, including, but not limited to, a monitor, a laptop computer, a tablet, or a mobile device, etc.

The shuttered wafer cleaning system 502 may include a controller 512. The controller 512 may be configured to control various physical apparatuses that control movement or functionality of the shuttered wafer cleaning system 502, such as for a robotic arm, a door, a rotational ring, a valve, shutter actuator, a cleaning nozzle and/or a wafer support. For example, the controller 512 may control a motor that may move a rotational ring, a valve, shutter actuator, and/or a wafer support. The controller may be controlled by the processor and may carry out the various aspects of the various processes discussed herein.

Figure 6A:
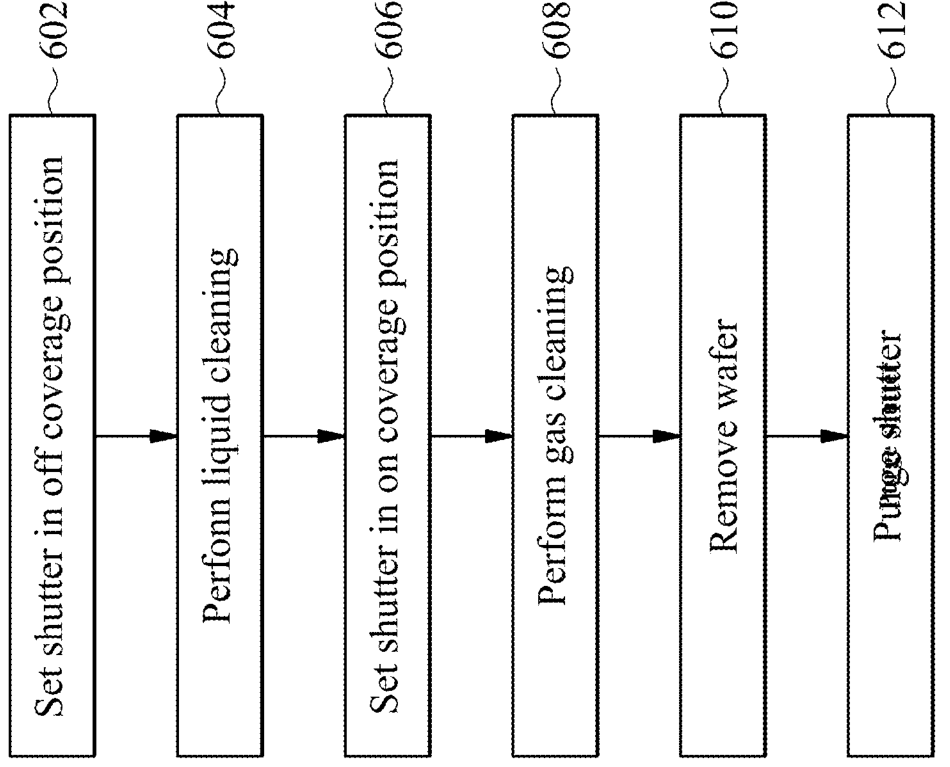
FIG. 6A is a flow chart of a wet shutter cleaning process, in accordance with some embodiments.

FIG. 6A is a flow chart of a wet shutter cleaning process 600, in accordance with some embodiments. The wet shutter cleaning process 600 may be performed by a shuttered wafer cleaning system, as introduced above. It is noted that the process 600 is merely an example, and is not intended to limit the present disclosure. Accordingly, it is understood that additional operations may be provided before, during, and after the process 600 of FIG. 6A, certain operations may be omitted, certain operations may be performed concurrently with other operations, and that some other operations may only be briefly described herein.

At operation 602, the shuttered wafer cleaning system may set a shutter to an off coverage position. As introduced above, a shutter may be configurable between at least an on coverage position and an off coverage position. At the on coverage position, the shutter may intercept residual liquid that may drip from a cleaning nozzle when the cleaning nozzle is not configured to actively dispense liquid onto the wafer (e.g., when a valve controlling access to a source of liquid is closed). Typically, the on coverage position is directly below the cleaning nozzle, so as to intercept falling liquid droplets from the cleaning nozzle. At the off coverage position, the shutter may be away from the cleaning nozzle to not interfere with liquid or gas dispensed from the cleaning nozzle. The off coverage position is not directly below the cleaning nozzle. Also, the shutter may assume the off coverage position when the cleaning nozzle is configured to actively dispense liquid onto the wafer (e.g., when a valve controlling access to a source of liquid is open). Also, the shutter may move between the on coverage position and the off coverage position by using a shutter actuator configured to move the shutter between the positions.

At operation 604, the shuttered wafer cleaning system may perform liquid cleaning. Liquid cleaning may refer to dispensing liquid from the cleaning nozzle to a wafer when the cleaning nozzle is in the active state (e.g., when a valve controlling the cleaning nozzle's access to a source of liquid is open). During liquid cleaning, liquid (e.g., cleaning chemicals and rinsing water) may be fed through the cleaning nozzle to generate a spray or stream of droplets which form a liquid coating on the upper surface of the wafer while the wafer is spun. The liquid utilized to clean the wafer 120 may include, for example: a piranha solution of sulfuric acid ($H_2SO_4$) and hydrogen peroxide ($H_2O_2$); an ammonia-peroxide mixture (APM) comprising ammonium hydroxide ($NH_4OH$) and water ($H_2O$); a hydrochloric peroxide mixture (HPM) comprising hydrochloric acid (HCL) and hydrogen peroxide ($H_2O_2$); hydrogen fluoride (HF); a ST-250 cleaning solution; ozone ($O_3$) and water ($H_2O$); phosphoric acid ($H_3PO_4$); tetramethylammonium hydroxide (TMAH); $CO_2$ and water ($H_2O$); water ($H_2O$); isopropyl alcohol (IPA); citric acid ($C_6H_3O_7$); nitric acid ($HNO_3$); acetic acid ($C_3COOH$); a phosphoric acid ($H_3PO_4$), nitric acid ($HNO_3$) and hydrogen fluoride (HF) mixture; and a nitric acid ($HNO_3$), acetic acid ($C_3COOH$), and phosphoric acid ($H_3PO_4$) mixture.

Additionally, as part of liquid cleaning, the wafer may be rinsed using water (e.g., deionized water) after application of the liquid cleaning solution or cleaning chemical. In certain embodiments, the wafer is both exposed to the liquid cleaning solution and the rinsing water in-situ.

At operation 606, the shuttered wafer cleaning system may set the shutter to an on coverage position. As noted above, at the on coverage position, the shutter may intercept residual liquid that may drip from a cleaning nozzle when the cleaning nozzle is not configured to actively dispense liquid onto the wafer (e.g., when a valve controlling access to a source of liquid is closed). As noted above, the on coverage position is directly below the cleaning nozzle, so as to intercept falling liquid droplets from the cleaning nozzle.

At operation 608, the shuttered wafer cleaning system may perform gas cleaning. Gas cleaning may refer to dispensing gas from the cleaning nozzle to a wafer when the cleaning nozzle is in the active state (e.g., when a valve controlling the cleaning nozzle's access to a source of gas is open). During gas cleaning, the dispensed gas may be fed through the cleaning nozzle toward the upper surface of the wafer while the wafer is spun. In certain embodiments, the gas may be dispensed from the cleaning nozzle during rinsing steps of wafer cleaning. The gas utilized to clean the wafer may include, for example, nitrogen ($N_2$) gas, ambient air, filtered ambient air, and/or isopropyl alcohol (IPA) vapor.

At operation 610, the shuttered wafer cleaning system may remove the wafer from a wafer support. In certain embodiments, a robotic arm may move its gripper hand under the wafer within a clearance between the wafer and an underlying pedestal and lift the wafer up over the pedestal and retract through a doorway and out of a housing for the shuttered wafer cleaning system. In certain embodiments, the wafer is unlocked (e.g., unsecured) from being actively gripped or secured by the wafer support before the robotic arm removes the wafer.

At operation 612, the shuttered wafer cleaning system may purge liquid from the shutter. Purging the liquid from the shutter refers to utilizing pressurized gas or air to push or remove any accumulated liquid on the shutter. The liquid may be purged by gas dispensing from the cleaning nozzle at a purge force (e.g., pressure per unit area) that is the same or greater than a force of gas at the cleaning nozzle utilized for cleaning the a wafer. Also, the shuttered wafer cleaning system may be configured to purge the liquid that accumulates on the shutter when an underlying wafer is removed (e.g., moved away from a wafer support directly below the shutter in an on coverage position. As noted above, in certain embodiments different portals of the cleaning nozzle may dispense different liquids and/or gases. Thus, even though gas cleaning may be performed after liquid cleaning, residual liquid in the cleaning nozzle (e.g., within the liquid's respective portal and/or line) may still drip from the cleaning nozzle even after gas cleaning.

Furthermore, a process of purging may involve maintaining the cleaning nozzle in the on coverage position and setting a portal for gas dispensation to an active state (e.g., modulating an associated valve) for dispensation of the gas at the purge force. The duration of the gas dispensation at purge force may be less than the duration of gas dispensation when cleaning the wafer.

Figure 6B:
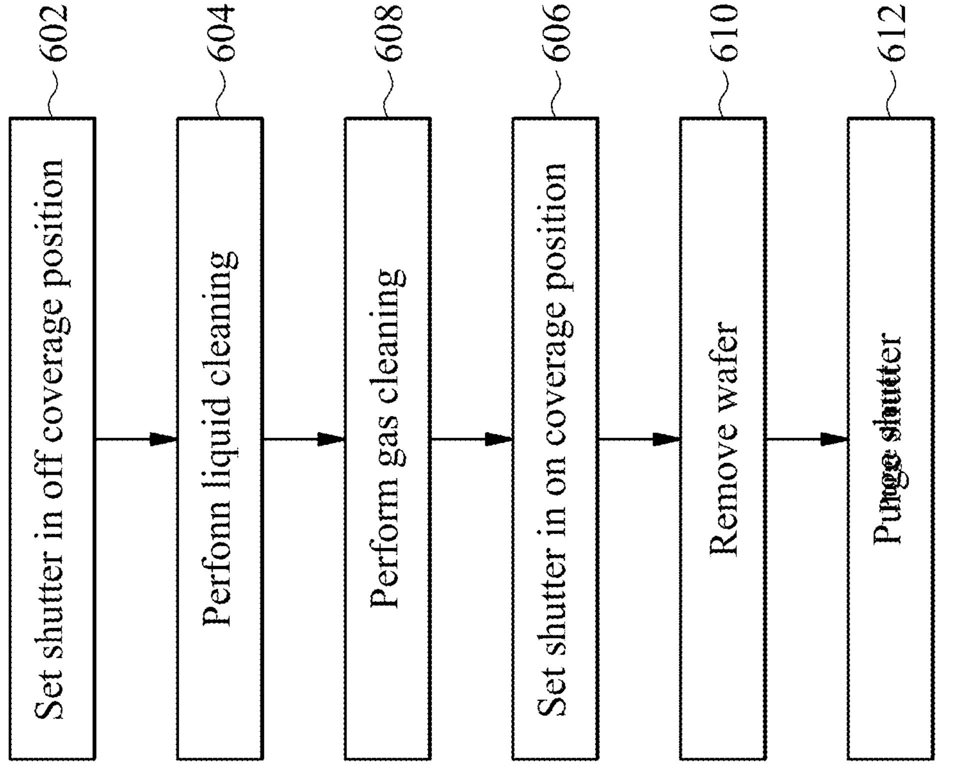
FIG. 6B is a flow chart of a dry shutter cleaning process, in accordance with some embodiments.

FIG. 6B is a flow chart of a dry shutter cleaning process 650, in accordance with some embodiments. The dry shutter cleaning process 650 may be performed by a shuttered wafer cleaning system, as introduced above. It is noted that the process 650 is merely an example, and is not intended to limit the present disclosure. Accordingly, it is understood that additional operations may be provided before, during, and after the process 650 of FIG. 6B, certain operations may be omitted, certain operations may be performed concurrently with other operations, and that some other operations may only be briefly described herein.

With the dry shutter cleaning process 650, the shutter may be set in an on coverage position after performance of gas cleaning (e.g., after finishing gas cleaning) and not before performance of gas cleaning. Stated another way, operation 606 is immediately before operation 608 in FIG. 6A but operation 606 is immediately after operation 608 in FIG. 6B. Otherwise, the individual operations of the dry shutter cleaning process 650 may be the same as that of the wet shutter cleaning process 600 of FIG. 6A. In certain embodiments, the pressure of the dispensed gas during gas cleaning may be sufficiently low to not dislodge liquid droplets that have accumulated on a shutter during operation 606. Accordingly, discussion of the individual operations will not be repeated for brevity.

In an embodiment, a system includes: a wafer support configured to secure a wafer; a nozzle configured to dispense a liquid or a gas on the wafer when the nozzle is in an active state of dispensing; a shutter configured to catch the liquid from the nozzle when the shutter is in a first position below the nozzle; and a shutter actuator configured to: move the shutter to the first position in response to the nozzle being in an inactive state; move the shutter to a second position away from the first position in response to the nozzle being in the active state.

In an embodiment, a method includes: securing a wafer via a wafer support; moving a shutter to a first position below a nozzle in response to the nozzle being in an inactive state, wherein the nozzle is configured to dispense a liquid or a gas on the wafer when the nozzle is in an active state of dispensing, and wherein the shutter is configured to catch the liquid from the nozzle when the shutter is in the first position; moving the shutter to a second position away from the first position in response to the nozzle being in the active state; and rotating a rotational ring abutting the nozzle around a central axis.

In another embodiment, a method includes: setting a shutter in an off coverage position, wherein the shutter is configured to be in either an on coverage position below a nozzle or the off coverage position away from the on coverage position; performing liquid cleaning on a wafer secured in a wafer support, wherein the liquid cleaning comprises dispensing a liquid from the nozzle; and setting the shutter to the on coverage position in response to finishing the liquid cleaning.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the disclosure.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:

a nozzle configured to dispense a liquid or a gas onto a wafer;

a shutter configured to catch the liquid from the nozzle when the shutter is in a first position below the nozzle; and a shutter actuator configured to:

move the shutter to the first position when the nozzle is not dispensing the liquid or the gas on the wafer; and move the shutter to a second position away from the first position when the nozzle is dispensing the liquid or the gas on the wafer.

2. The system of claim 1, wherein the shutter in the first position contacts and covers the nozzle.

3. The system of claim 1, wherein the shutter is separated from the nozzle in the first position.

4. The system of claim 1, wherein the shutter is directly below the nozzle in the first position.

5. The system of claim 1, wherein the shutter is laterally displaced from the nozzle in the second position.

6. The system of claim 1, wherein the nozzle is configured to dispense the liquid and not the gas.

7. The system of claim 1, wherein the shutter comprises a concavity.

8. The system of claim 1, wherein the nozzle is configured to dispense the gas on the shutter in the first position.

9. A system, comprising:
- a nozzle comprising a first portal to dispense a liquid onto a wafer and a second portal to dispense a first gas onto the wafer;
- a shutter configured to be in a first position away from the nozzle during a liquid cleaning process, and in a second position below the nozzle when the first portal is closed so as to collect residual liquid dripping from the first portal and prevent the residual liquid from dripping onto the wafer; and
- a controller configured to move the shutter between the first position and the second position, and control dispensing the liquid from the first portal and dispensing the first gas from the second portal.

10. The system of claim 9, wherein the shutter in the second position reduces an amount of pressure exerted onto the wafer by the first gas onto the wafer as the first gas is dispensed by the second portal.

11. The system of claim 9, wherein the nozzle is configured to be vertically moved toward and away from the wafer.

12. The system of claim 9, wherein the nozzle comprises a third portal configured to dispense a second gas after the first gas is dispensed.

13. The system of claim 9, wherein the nozzle comprises a rotational ring laterally surrounding the nozzle.

14. The system of claim 9, wherein the liquid comprises at least one of:
- a piranha solution of sulfuric acid ($H_2SO_4$) and hydrogen peroxide ($H_2O_2$);
- an ammonia-peroxide mixture (APM) comprising ammonium hydroxide ($NH_4OH$) and water ($H_2O$);
- a hydrochloric peroxide mixture (HPM) comprising hydrochloric acid (HCL) and hydrogen peroxide ($H_2O_2$);
- hydrogen fluoride (HF);
- ozone ($O_3$) and water ($H_2O$);
- phosphoric acid ($H_3PO_4$);
- tetramethylammonium hydroxide (TMAH);
- CO2 and water ($H_2O$);
- water ($H_2O$);
- isopropyl alcohol (IPA);
- citric acid ($C_6H_8O_7$);
- nitric acid ($HNO_3$);
- acetic acid ($C_3COOH$);
- a phosphoric acid ($H_3PO_4$), nitric acid ($HNO_3$) and hydrogen fluoride (HF) mixture; and a nitric acid ($HNO_3$), acetic acid ($C_3COOH$), and phosphoric acid ($H_3PO_4$) mixture.

15. A system, comprising:
- a nozzle comprising a first portal to dispense a first gas onto a wafer, a second portal to dispense a second gas onto the wafer and a third portal to dispense a liquid onto the wafer;
- a shutter configured to be in a first position away from the nozzle during a liquid cleaning process, and in a second position below the nozzle when the first portal is closed so as to collect residual liquid dripping from the third portal and prevent the residual liquid from dripping onto the wafer; and
- a controller configured to move the shutter between the first position and the second position, and control dispensing the first gas from the first portal, the second gas from the second portal, and the liquid from the third portal.

16. The system of claim 15, wherein the shutter in the second position reduces an amount of pressure exerted onto the wafer by the first gas onto the wafer as the first gas is dispensed by the second portal.

17. The system of claim 15, wherein the nozzle is configured to be vertically moved toward and away from the wafer.

18. The system of claim 15, wherein the third portal configured to dispense deionized water.

19. The system of claim 15, wherein the nozzle comprises a rotational ring laterally surrounding the nozzle.

20. The system of claim 15, wherein the first portal surrounds the second and third portals.

* * * * *